(12) United States Patent
Tsukui et al.

(10) Patent No.: US 12,538,756 B2
(45) Date of Patent: Jan. 27, 2026

(54) VAPOR PHASE GROWTH APPARATUS AND REFLECTOR

(71) Applicant: NuFlare Technology, Inc., Kanagawa (JP)

(72) Inventors: Masayuki Tsukui, Yokohama (JP); Yasushi Iyechika, Matsudo (JP); Kiyotaka Miyano, Tokyo (JP); Yoshitaka Ishikawa, Yokohama (JP)

(73) Assignee: NuFlare Technology, Inc., Kanagawa (JP)

( * ) Notice: Subject to any disclaimer, the term of this patent is extended or adjusted under 35 U.S.C. 154(b) by 389 days.

(21) Appl. No.: 18/301,748

(22) Filed: Apr. 17, 2023

(65) Prior Publication Data

US 2023/0357954 A1  Nov. 9, 2023

(30) Foreign Application Priority Data

May 6, 2022  (JP) .................................. 2022-076607
Mar. 17, 2023  (JP) ................................. 2023-043640

(51) Int. Cl.
  *H01L 21/687*  (2006.01)
  *C23C 16/455*  (2006.01)
  (Continued)

(52) U.S. Cl.
  CPC .... *H01L 21/68785* (2013.01); *C23C 16/4586* (2013.01); *C23C 16/481* (2013.01);
  (Continued)

(58) Field of Classification Search
  CPC ......... H01L 21/67098; H01L 21/67115; H01L 21/67248; H01L 21/68735;
  (Continued)

(56) References Cited

U.S. PATENT DOCUMENTS 5,059,770 A * 10/1991 Mahawili .............. H01L 23/345
219/390
5,099,791 A * 3/1992 Tsukazaki ................ H05H 3/00
118/723 CB
(Continued)

FOREIGN PATENT DOCUMENTS

JP  2013128086 A  6/2013
JP  2018-41952 A  3/2018
TW  202204668 A  2/2022

OTHER PUBLICATIONS

Pyrolytic Graphite Brochure—American Elements (captured Oct. 17, 2021 via WayBackMachine) (Year: 2021).*
(Continued)

*Primary Examiner* — Kurt Sweely
(74) *Attorney, Agent, or Firm* — RANKIN, HILL & CLARK LLP (57) ABSTRACT

A vapor phase growth apparatus of embodiments includes: a reactor; a holder provided in the reactor to place a substrate thereon; an annular out-heater provided below the holder; an in-heater provided below the out-heater; a disk-shaped upper
(Continued)

reflector provided below the in-heater and formed of pyrolytic graphite; and a disk-shaped lower reflector provided below the upper reflector, formed of silicon carbide, and having a thickness smaller than that of the upper reflector.

7 Claims, 3 Drawing Sheets

(51) Int. Cl.
*C23C 16/458* (2006.01)
*C23C 16/46* (2006.01)
*C23C 16/48* (2006.01)
*C30B 25/10* (2006.01)

(52) U.S. Cl.
CPC ........ *C30B 25/10* (2013.01); *C23C 16/45565* (2013.01); *C23C 16/4584* (2013.01); *C23C 16/46* (2013.01); *H01L 21/68735* (2013.01)

(58) Field of Classification Search
CPC ......... H01L 21/68757; H01L 21/68785; H01L 21/68792; C23C 16/45565; C23C 16/4584; C23C 16/4585; C23C 16/4586; C23C 16/46; C23C 16/481; C23C 16/482; H01J 37/32522; H01J 37/32724; C30B 25/10

See application file for complete search history.

(56) References Cited

U.S. PATENT DOCUMENTS

| | | | |
|---|---|---|---|
| 2012/0070577 A1* | 3/2012 | Deura | C23C 16/4584 118/58 |
| 2012/0244684 A1 | 9/2012 | Suzuki et al. | |
| 2013/0008581 A1* | 1/2013 | Yuki | H01L 21/68785 156/379 |
| 2014/0235072 A1* | 8/2014 | Ito | H01L 21/67115 392/416 |
| 2018/0090364 A1* | 3/2018 | Moriyama | C23C 16/4584 |
| 2019/0078211 A1* | 3/2019 | Kuenle | C23C 16/4584 |
| 2019/0271072 A1 | 9/2019 | Tsukui et al. | |
| 2020/0114525 A1* | 4/2020 | Wada | H01L 21/67132 |
| 2020/0115822 A1* | 4/2020 | Ishikawa | C23C 16/482 |
| 2020/0373175 A1* | 11/2020 | Kim | H01L 21/6719 |

OTHER PUBLICATIONS

Taiwanese Office Action (TWOA) dated Jun. 19, 2024 for Taiwanese Patent Application No. 112116378; English machine translation.

* cited by examiner

VAPOR PHASE GROWTH APPARATUS AND REFLECTOR

CROSS-REFERENCE TO RELATED APPLICATION

This application is based upon and claims the benefit of priority from Japanese Patent Applications No. 2022-076607, filed on May 6, 2022, and the benefit of priority from Japanese Patent Applications No. 2023-043640, filed on Mar. 17, 2023, the entire contents of which are incorporated herein by reference.

FIELD OF THE INVENTION

Embodiments relate to a vapor phase growth apparatus for forming a film by supplying a gas and a reflector.

BACKGROUND OF THE INVENTION

As a method of forming a high-quality semiconductor film, there is an epitaxial growth technique in which a single crystal film is grown on a substrate, such as a wafer, by vapor phase growth. In a vapor phase growth apparatus using the epitaxial growth technique, a wafer is placed on a support portion in a reactor maintained at atmospheric pressure or reduced pressure.

Then, while heating the wafer, a process gas such as a source gas, which is a raw material for film formation, is supplied from the upper part of the reactor to the wafer surface in the reactor. A thermal reaction of the source gas occurs on the wafer surface, and an epitaxial single crystal film is formed on the wafer surface.

The wafer is heated by a heater provided below the wafer. A reflector is provided below the heater. The reflector improves the heating efficiency of the wafer by the heater. In addition, the reflector prevents members below the heater from being heated.

In case the reflector is provided below the heater, thermal stress may occur due to the temperature gradient in the reflector, which may reduce the durability of the reflector.

SUMMARY OF THE INVENTION

A vapor phase growth apparatus of embodiments includes: a reactor; a holder provided in the reactor configured to place a substrate thereon; an annular out-heater provided below the holder; an in-heater provided below the out-heater; a disk-shaped upper reflector provided below the in-heater and formed of pyrolytic graphite; and a disk-shaped lower reflector provided below the upper reflector, formed of silicon carbide, and having a thickness smaller than a thickness of the upper reflector.

A reflector of embodiments is used in a vapor phase growth apparatus, is formed of pyrolytic graphite, has a disk shape, and has at least one of a notched portion and a through hole in its outer peripheral region.

A vapor phase growth apparatus of embodiments includes: a reactor; a holder provided in the reactor to place a substrate thereon; an annular out-heater provided below the holder; an in-heater provided below the out-heater; a disk-shaped upper reflector provided below the in-heater and formed of a material having a thermal shock resistance of 1000 kW/m or more; and a disk-shaped lower reflector provided below the upper reflector, formed of silicon carbide, and having a thickness smaller than a thickness of the upper reflector.

A reflector of embodiments is used in a vapor phase growth apparatus, is formed of a material having a thermal shock resistance of 1000 kW/m or more, has a disk shape, and has at least one of a notched portion and a through hole in its outer peripheral region.

DETAILED DESCRIPTION OF THE EMBODIMENTS

Hereinafter, embodiments will be described with reference to the diagrams.

In this specification, the same or similar members may be denoted by the same reference numerals.

In this specification, the direction of gravity in a state in which a vapor phase growth apparatus is installed so that a film can be formed is defined as "down", and the opposite direction is defined as "up". Therefore, "lower" means a position in the direction of gravity with respect to the reference, and "downward" means the direction of gravity with respect to the reference. Then, "upper" means a position in a direction opposite to the direction of gravity with respect to the reference, and "upward" means a direction opposite to the direction of gravity with respect to the reference. In addition, the "vertical direction" is the direction of gravity.

In addition, in this specification, "process gas" is a general term for gases used for film formation on a substrate, and is a concept including, for example, a source gas, a carrier gas, and a dilution gas.

A vapor phase growth apparatus of embodiments includes: a reactor; a holder provided in the reactor configured to place a substrate thereon; an annular out-heater provided below the holder; an in-heater provided below the out-heater; a disk-shaped upper reflector provided below the in-heater and formed of pyrolytic graphite; and a disk-shaped lower reflector provided below the upper reflector, formed of silicon carbide, and having a thickness smaller than that of the upper reflector.

In addition, a reflector of embodiments is used in a vapor phase growth apparatus, is formed of pyrolytic graphite, has a disk shape, has a notched portion on its outer periphery, and has a through hole in its outer peripheral region separated from the center by 40% or more of the outer diameter.

Figure 1:
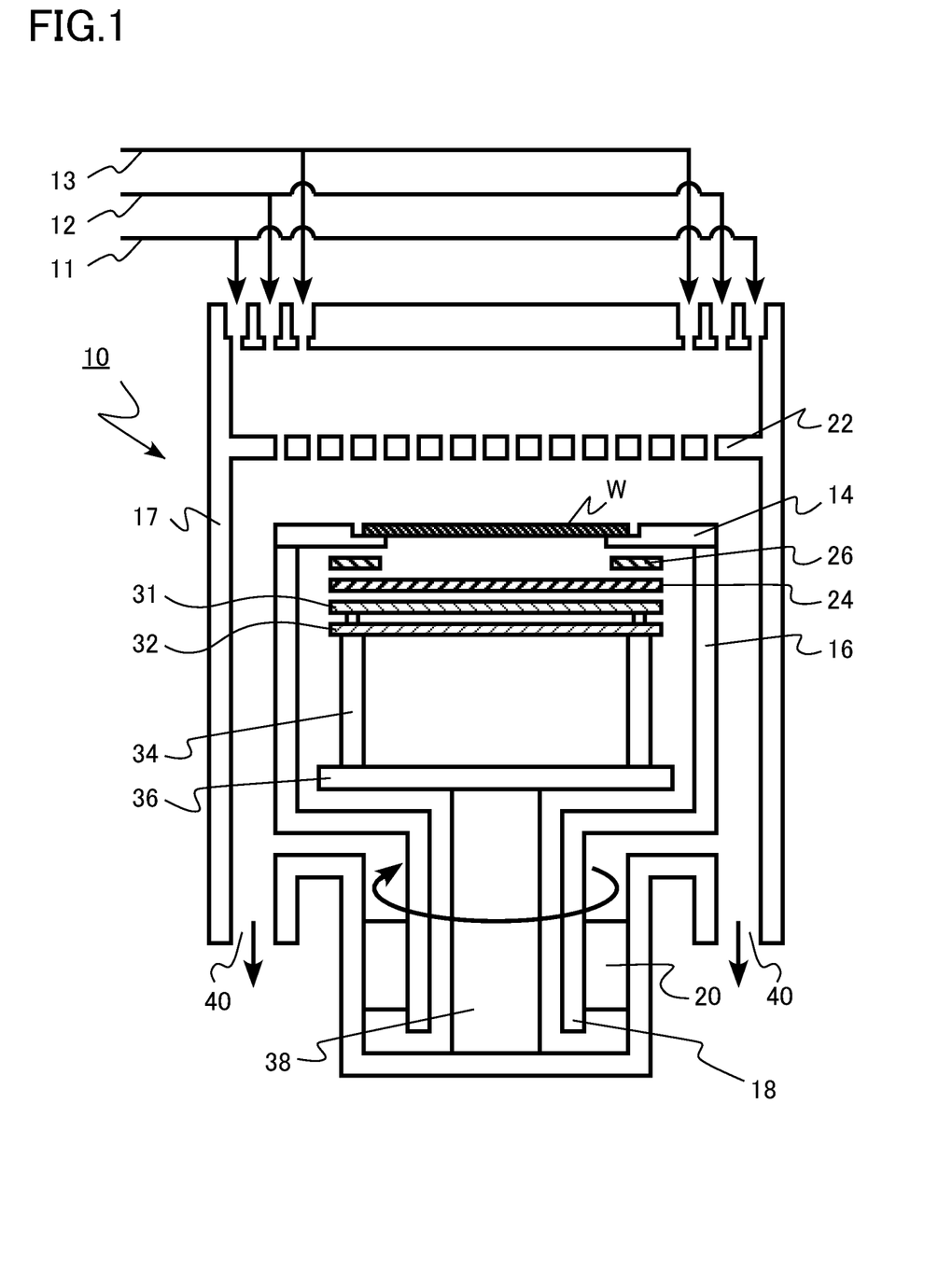
FIG. 1 is a schematic cross-sectional view of a vapor phase growth apparatus of embodiments.

FIG. 1 is a schematic cross-sectional view of the vapor phase growth apparatus of embodiments. The vapor phase growth apparatus of embodiments is, for example, a single wafer type epitaxial growth apparatus using a metal organic chemical vapor deposition method (MOCVD method).

The vapor phase growth apparatus of embodiments includes a reactor 10, a first gas supply line 11, a second gas supply line 12, and a third gas supply line 13. The reactor 10 includes a holder 14, a rotator unit 16, a rotating shaft 18, a rotation driving mechanism 20, a shower plate 22, an in-heater 24, an out-heater 26, an upper reflector 31, a lower reflector 32, a support column 34, a fixed table 36, a fixed shaft 38, and a gas discharge port 40. The upper reflector 31 and the lower reflector 32 form a reflector unit of embodiments.

A process gas is supplied to the reactor 10 through the first gas supply line 11, the second gas supply line 12, and the third gas supply line 13.

For example, a first process gas containing an organic metal of a group III element and a carrier gas is supplied to the reactor 10 through the first gas supply line 11. The first process gas is a gas containing a group III element when forming a group III-V semiconductor film on a wafer W.

The group III element is, for example, gallium (Ga), aluminum (Al), and indium (In). The organic metal is, for example, trimethylgallium (TMG), trimethylaluminum (TMA), and trimethylindium (TMI).

For example, a second process gas containing ammonia ($NH_3$) is supplied to the reactor 10 through the second gas supply line 12. The second process gas is a gas containing a group V element when forming a group III-V semiconductor film on the wafer W. The group V element is, for example, nitrogen (N).

For example, a dilution gas for diluting the first process gas and the second process gas is supplied to the reactor 10 through the third gas supply line 13. By diluting the first process gas and the second process gas with the dilution gas, the concentrations of the group III element and the group V element supplied to the reactor 10 are adjusted. The dilution gas is, for example, an inert gas. The dilution gas is, for example, a hydrogen gas, a nitrogen gas, an argon gas, or a mixed gas of the above gases.

The reactor 10 has a cylindrical wall surface 17 formed of stainless steel, for example. The shower plate 22 is provided in an upper portion of the reactor 10. A plurality of gas ejection holes are provided in the shower plate 22. A process gas is supplied into the reactor 10 through the plurality of gas ejection holes.

The holder 14 is provided inside the reactor 10. The wafer W, which is an example of a substrate, can be placed on the holder 14. The holder 14 has, for example, an annular shape. For example, an opening is provided at the center of the holder 14 for direct radiation heating of the wafer W from the back surface.

The holder 14 is fixed to the top of the rotator unit 16. The rotator unit 16 is fixed to the rotating shaft 18. The holder 14 is indirectly fixed to the rotating shaft 18.

The material of the holder 14 is, for example, ceramics. Ceramics that are the material of the holder 14 are, for example, silicon carbide, tantalum carbide, boron nitride, and silicon nitride. Carbon can also be used as a material of the holder 14. As a material of the holder 14, it is also possible to use a material obtained by coating carbon with ceramics such as silicon carbide, tantalum carbide, boron nitride, and silicon nitride.

The rotating shaft 18 can be rotated by the rotation driving mechanism 20. By rotating the rotating shaft 18 using the rotation driving mechanism 20, it is possible to rotate the holder 14. By rotating the holder 14, it is possible to rotate the wafer W placed on the holder 14.

The rotation driving mechanism 20 can rotate the wafer W at a rotation speed of, for example, 50 rpm or more and 3000 rpm or less. The rotation driving mechanism 20 is formed by, for example, a motor and a bearing.

The in-heater 24 and the out-heater 26 are provided below the holder 14. The in-heater 24 and the out-heater 26 are provided inside the rotator unit 16. The out-heater 26 is provided between the in-heater 24 and the holder 14.

The out-heater 26 is provided below the holder 14. The in-heater 24 is provided below the out-heater 26.

The in-heater 24 has, for example, an approximately disk shape. The out-heater 26 has, for example, an approximately annular shape with a notch. Each of the in-heater 24 and the out-heater 26 has an electrode connecting portion (not shown), and may have a predetermined pattern.

Each of the in-heater 24 and the out-heater 26 is connected to an electrode (not shown), and generates heat when a predetermined voltage is applied to heat the wafer W held by the holder 14. The in-heater 24 heats at least a central portion of the wafer W based on the temperature of the central portion measured by a radiation thermometer, for example. The out-heater 26 mainly heats the holder 14 based on the temperature of the outer peripheral portion of the wafer W measured by a radiation thermometer, thereby heating the outer peripheral portion of the wafer W by thermal conduction, for example. When heating the wafer W, for example, the temperature of the out-heater 26 is set to be higher than the temperature of the in-heater 24.

The upper reflector 31 is provided below the in-heater 24. The upper reflector 31 has an approximately disk shape.

The upper reflector 31 is formed of pyrolytic graphite. The material forming the upper reflector 31 is pyrolytic graphite. Pyrolytic graphite is graphite formed by using a vapor phase growth method.

Pyrolytic graphite has a thermal shock resistance of 1000 kW/m or more and 20000 kW/m or less. Thermal shock is a phenomenon in which shocking thermal stress occurs in an object due to a sharp change in temperature.

Assuming that a thermal conductivity is K (W/m·K), a flexural strength is S (MPa), a thermal expansion coefficient is α ($10^{-6}$/K), and a Young's modulus is E (GPa), a thermal shock resistance R (kW/m) can be expressed by the following equation.

$$R=(K \cdot S)/(\alpha \cdot E)$$

The density of pyrolytic graphite is 2.0 g/cm$^3$ or more and 2.3 g/cm$^3$ or less.

The thickness of the upper reflector 31 is, for example, 0.8 mm or more and 3 mm or less.

The lower reflector 32 is provided below the upper reflector 31. The lower reflector 32 has an approximately disk shape.

The lower reflector 32 is formed of silicon carbide. The material of the lower reflector 32 is silicon carbide. The lower reflector 32 is formed of, for example, sintered SiC. However, the material of the lower reflector 32 is not necessarily limited to silicon carbide.

The thickness of the lower reflector 32 is smaller than the thickness of the upper reflector 31. In other words, the thickness of the upper reflector 31 is larger than the thickness of the lower reflector 32.

The thickness of the lower reflector 32 is, for example, 0.3 to 0.8 times the thickness of the upper reflector 31.

The thickness of the lower reflector 32 is, for example, 0.5 mm or more and 1 mm or less.

The upper reflector 31 and the lower reflector 32 reflect heat radiated downward from the in-heater 24 and the out-heater 26. The upper reflector 31 and the lower reflector 32 improve the heating efficiency of the wafer W. In addition, the upper reflector 31 and the lower reflector 32 prevent members below the in-heater 24 and the out-heater 26 from being heated. In addition, as will be described later, a notched portion may be provided in each of the upper reflector 31 and the lower reflector 32.

The upper reflector 31 and the lower reflector 32 are supported on a fixed table 36 by, for example, a plurality of support columns 34. The fixed table 36 is supported by, for example, the fixed shaft 38.

In the rotator unit 16, a push up pin (not shown) is provided in order to place the wafer W on the holder 14 and remove the wafer W from the holder 14. The push up pin penetrates the upper reflector 31, the lower reflector 32, and the in-heater 24, for example.

A gas discharge port 40 is provided at the bottom of the reactor 10. Through the gas discharge port 40, a surplus reaction product after the source gas reacts on the surface of the wafer W and a surplus process gas are discharged to the outside of the reactor 10.

In addition, a wafer inlet/outlet and a gate valve (not shown) are provided on the wall surface 17 of the reactor 10. The wafer W can be loaded into the reactor 10 or unloaded to the outside of the reactor 10 through the wafer inlet/outlet and the gate valve.

Figure 2:
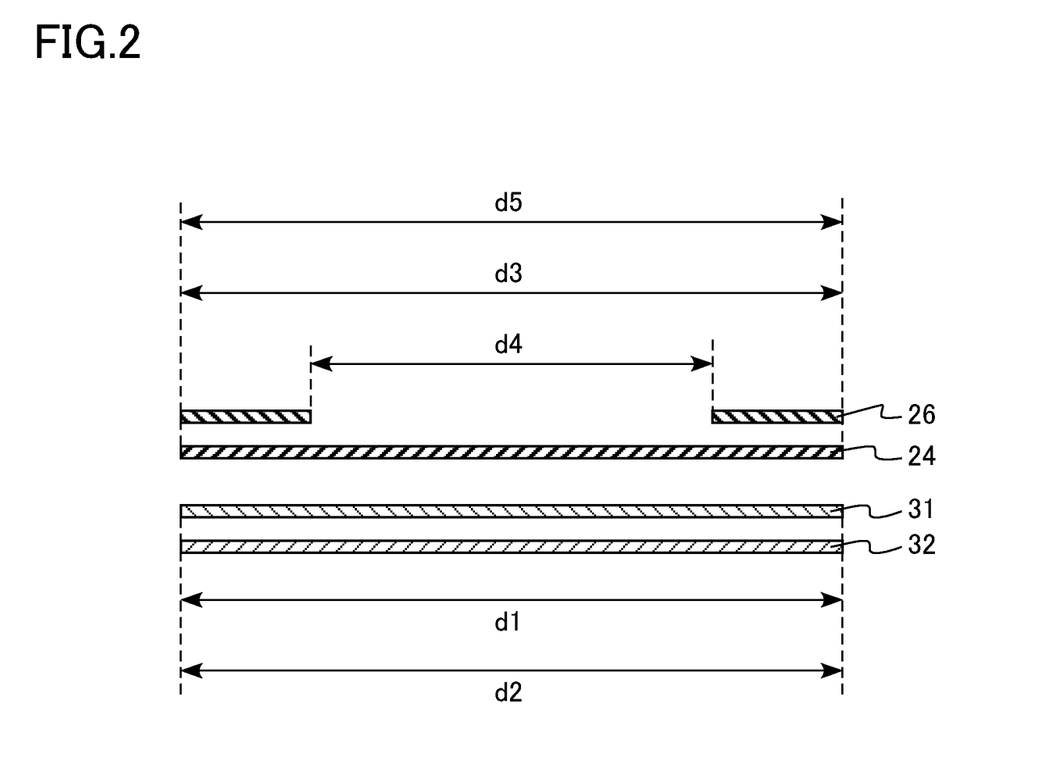
FIG. 2 is a schematic cross-sectional view of a part of the vapor phase growth apparatus of embodiments.

FIG. 2 is a schematic cross-sectional view of a part of the vapor phase growth apparatus of embodiments. FIG. 2 shows cross sections of the in-heater 24, the out-heater 26, the upper reflector 31, and the lower reflector 32.

FIG. 2 is an explanatory diagram of the relationship among the outer diameter d1 of the upper reflector 31, the outer diameter d2 of the lower reflector 32, the outer diameter d3 of the out-heater 26, the inner diameter d4 of the out-heater 26, and the outer diameter d5 of the in-heater 24.

The ratio of the inner diameter d4 of the out-heater 26 to the outer diameter d3 of the out-heater 26 is, for example, 70% or less. The ratio of the outer diameter d5 of the in-heater 24 to the outer diameter d3 of the out-heater 26 is, for example, 90% or more and 110% or less. The ratio of the outer diameter d1 of the upper reflector 31 to the outer diameter d3 of the out-heater 26 is, for example, 90% or more and 110% or less. The ratio of the outer diameter d2 of the lower reflector 32 to the outer diameter d3 of the out-heater 26 is, for example, 90% or more and 110% or less. The ratio of the outer diameter d2 of the lower reflector 32 to the outer diameter d1 of the upper reflector 31 is, for example, 90% or more and 110% or less.

The outer diameter d1 of the upper reflector 31 is, for example, 200 mm or more and 300 mm or less.

Figure 3A:
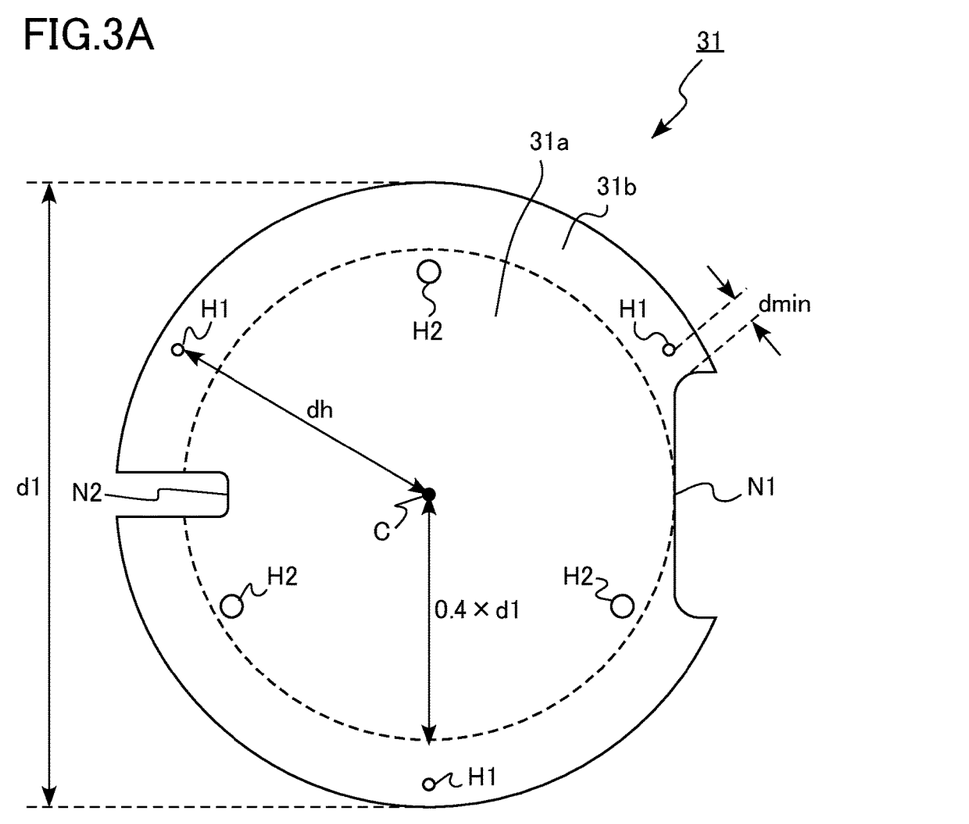
FIGS. 3A and 3B are schematic diagrams of a reflector of embodiments.
Figure 3B:
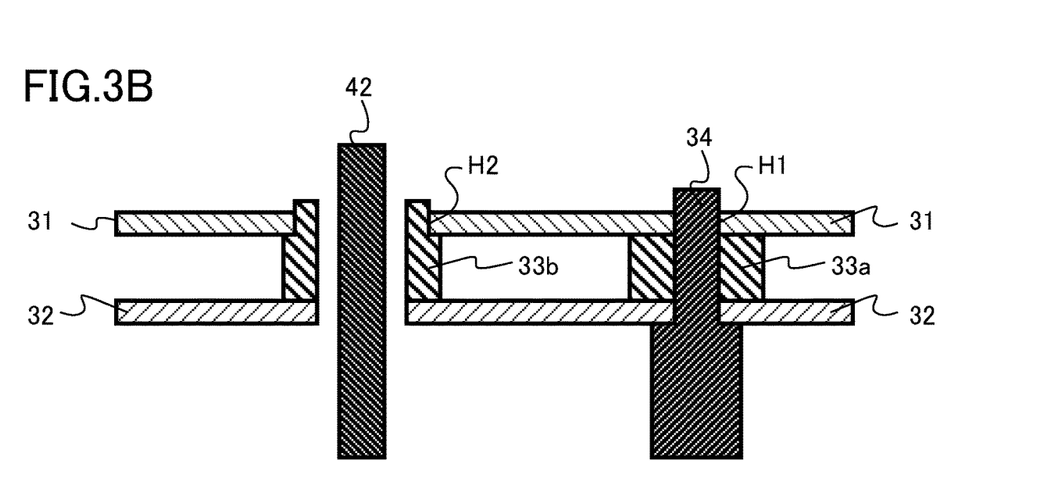

FIGS. 3A and 3B are schematic diagrams of a reflector of embodiments. FIG. 3A is a schematic top view of the upper reflector 31. FIG. 3B is a schematic cross-sectional view including parts of the upper reflector 31 and the lower reflector 32.

The upper reflector 31 has an inner region 31a and an outer region 31b. The outer region 31b is a region separated from the center (C in FIG. 3A) of the upper reflector 31 by 40% or more of the outer diameter d1 of the upper reflector 31. The outer region 31b surrounds the inner region 31a.

The upper reflector 31 includes a support column through hole H1, a push up pin through hole H2, a first notched portion N1, and a second notched portion N2. The support column through hole H1 is an example of a through hole. The first notched portion N1 and the second notched portion N2 are examples of a notched portion.

The support column through hole H1 is provided in the outer region 31b. The push up pin through hole H2 is provided in the inner region 31a.

A distance (dh in FIG. 3A) from the center C of the upper reflector 31 to the support column through hole H1 is, for example, 40% or more of the outer diameter d1 of the upper reflector 31.

As shown in FIG. 3B, the support column 34 penetrates a support column through hole of the lower reflector 32 and the support column through hole H1 of the upper reflector 31. Between the support column through hole of the lower reflector 32 and the support column through hole H1 and the support column 34, it is preferable to provide a clearance in consideration of thermal expansion of the upper reflector 31. The lower reflector 32 is supported by the support column 34.

As shown in FIG. 3B, a first spacer 33a is provided between the upper reflector 31 and the lower reflector 32. The first spacer 33a has, for example, an annular shape. The first spacer 33a is provided around the support column 34. The upper reflector 31 is supported on the lower reflector 32 by the first spacer 33a. The displacement of the upper reflector 31 in the horizontal direction is restrained by the support column 34.

As shown in FIG. 3B, a push up pin 42 penetrates the push up pin through hole of the lower reflector 32 and the push up pin through hole H2 of the upper reflector 31.

As shown in FIG. 3B, a second spacer 33b is provided between the upper reflector 31 and the lower reflector 32. The second spacer 33b has, for example, an annular shape. The second spacer 33b is provided around the push up pin 42. The upper reflector 31 is supported on the lower reflector 32 by the second spacer 33b. In addition, the second spacer 33b does not necessarily have to be provided.

The first notched portion N1 and the second notched portion N2 are provided on the outer periphery of the upper reflector 31 so as to face each other, for example. The first notched portion N1 and the second notched portion N2 are provided, for example, to allow a support portion (not shown) of the in-heater 24 and a support portion (not shown) of the out-heater 26 to pass therethrough. In addition, the first notched portion N1 and the second notched portion N2 are provided, for example, to allow an electrode (not shown) connected to the in-heater 24 and an electrode (not shown) connected to the out-heater 26 to pass therethrough.

A minimum distance (dmin in FIG. 3A) from the first notched portion N1 to the support column through hole H1 is, for example, 5% or less of the outer diameter d1 of the upper reflector 31.

Next, an example of a vapor phase growth method using the vapor phase growth apparatus of embodiments will be described.

Hereinafter, a case of forming a stacked film, in which a plurality of indium gallium nitride films (InGaN films) and a plurality of gallium nitride films (GaN films) are stacked, on a base GaN film will be described as an example. The stacked film described above is, for example, a multi quantum well (MQW) layer used for a light emitting layer of a light emitting diode (LED).

First, the wafer W is loaded into the reactor 10. Then, the wafer W is placed on the holder 14. The wafer W is, for example, a silicon substrate (Si substrate).

Then, while rotating the wafer W by the rotation driving mechanism 20, the wafer W is heated to, for example, 1000° C. or more and 1100° C. or less by the in-heater 24 and the out-heater 26 provided below the holder 14.

Then, the temperature of the wafer W is set to, for example, 1050° C., and a buffer layer of aluminum nitride (AlN) and aluminum gallium nitride (AlGaN) is formed on the wafer W by using TMA, TMG, and ammonia, and then a base GaN film is grown. Then, an InGaN film and a GaN film are alternately formed on the base GaN film to form an MQW layer.

When forming the InGaN film, the temperature of the wafer W is set to, for example, 850° C., and, for example, a mixed gas of TMG and TMI with a nitrogen gas as a carrier gas is supplied to the reactor 10 through the first gas supply line 11. In addition, for example, ammonia and nitrogen gas are supplied to the reactor 10 through the second gas supply line 12. In addition, for example, a nitrogen gas is supplied to the reactor 10 as a dilution gas through the third gas supply line 13.

When forming the GaN film, the temperature of the wafer W is set to, for example, 900° C., and, for example, TMG with a nitrogen gas as a carrier gas is supplied to the reactor 10 through the first gas supply line 11. In addition, for example, ammonia and nitrogen gas are supplied to the reactor 10 through the second gas supply line 12. In addition, for example, a nitrogen gas is supplied to the reactor 10 as a dilution gas through the third gas supply line 13.

After forming the MQW layer, the heating by the in-heater 24 and the out-heater 26 is stopped to lower the temperature of the wafer W. Thereafter, the wafer W is unloaded from the reactor 10.

Next, the function and effect of the reflector unit and the vapor phase growth apparatus of embodiments will be described.

The properties of an epitaxial single crystal film formed on the wafer surface depend on the temperature of the wafer. For this reason, it is desired to achieve high temperature uniformity within the wafer surface.

The vapor phase growth apparatus of embodiments includes the in-heater 24 and the out-heater 26 as heaters for heating the wafer W. By heating at least the central portion of the wafer W with the in-heater 24 and heating the outer peripheral portion of the wafer W or the holder 14 with the out-heater 26, the temperature uniformity within the wafer surface is improved.

In addition, the vapor phase growth apparatus of embodiments includes the upper reflector 31 and the lower reflector 32 below the in-heater 24 and the out-heater 26. Since the vapor phase growth apparatus of embodiments includes the upper reflector 31 and the lower reflector 32, the heating efficiency of the wafer W is improved. In addition, since the heating of members below the in-heater 24 and the out-heater 26 by the in-heater 24 and the out-heater 26 is prevented, deterioration of the members due to the heating of the members is suppressed.

When the upper reflector 31 and the lower reflector 32 are provided below the in-heater 24 and the out-heater 26, thermal stress occurs due to the temperature gradient in the upper reflector 31 and the lower reflector 32. Thermal stress may damage the upper reflector 31 and the lower reflector 32. In particular, high thermal stress is likely to occur in the upper reflector 31 directly facing the in-heater 24. Therefore, the upper reflector 31 is more likely to be damaged than the lower reflector 32.

The temperature of the upper reflector 31 is higher on the outer peripheral side heated by both the in-heater 24 and the out-heater 26, and decreases toward the central portion and the outer peripheral edge. The temperature gradient in the upper reflector 31 is particularly large at the outer peripheral edge of the upper reflector 31. For this reason, the thermal stress in the vicinity of the outer peripheral edge of the upper reflector 31 increases. Therefore, there is a high possibility that the upper reflector 31 will be damaged in the vicinity of the outer peripheral edge of the upper reflector 31.

The upper reflector 31 of embodiments is formed of pyrolytic graphite. By using pyrolytic graphite as a material of the upper reflector 31, damage to the upper reflector 31 is suppressed to improve durability as compared with a case where the material is silicon carbide.

It is thought that the reason why the heat resistance of the upper reflector 31 is improved, as compared with the case where the material is silicon carbide, by using pyrolytic graphite as a material of the upper reflector 31 is that pyrolytic graphite has a higher thermal shock resistance than silicon carbide. Pyrolytic graphite has a thermal shock resistance of 1000 kW/m or more, which is higher than that of graphite obtained by sintering, for example. In addition, the flexural strength S, which is used when calculating the thermal shock resistance R, has temperature dependence. In silicon carbide, the flexural strength S decreases at high temperature, whereas in pyrolytic graphite, the flexural strength S increases as the temperature rises. For this reason, pyrolytic graphite is more suitable for use as a high temperature component.

The lower reflector 32 of embodiments is formed of silicon carbide. By using silicon carbide as a material of the lower reflector 32, the cost of the lower reflector 32 can be reduced as compared with a case where the material is pyrolytic graphite.

The thickness of the lower reflector 32 of embodiments is smaller than the thickness of the upper reflector 31. In other words, the thickness of the upper reflector 31 is larger than the thickness of the lower reflector 32.

By making the upper reflector 31 thick, heating of members below the in-heater 24 and the out-heater 26 is suppressed. In addition, since processing from the base material of pyrolytic graphite becomes easy, the cost can be reduced.

In addition, the lower reflector 32 formed of silicon carbide is more likely to be damaged due to its increased thickness. By making the lower reflector 32 formed of silicon carbide thin, damage to the lower reflector 32 is suppressed to improve the durability of the lower reflector 32.

If there is a notched portion or a through hole in the vicinity of the outer peripheral edge of the upper reflector 31 where thermal stress increases, the upper reflector 31 is likely to be damaged starting from the notched portion or the through hole. In addition, if the distance between the notched portion and the through hole is shortened, damage to the upper reflector 31 is more likely to occur. In addition, when a through hole is fixed to the support column 34 and there is no clearance, the displacement of the upper reflector 31 due to thermal stress is suppressed, so that the upper reflector 31 is more likely to be damaged.

The first notched portion N1 and the second notched portion N2 are provided on the outer periphery of the upper reflector 31 of embodiments. In addition, the support column through hole H1 is provided in the outer region 31b. In addition, the minimum distance (dmin in FIG. 3A) from the first notched portion N1 to the support column through hole H1 is as short as 5% or less of the outer diameter d1 of the upper reflector 31.

However, since the upper reflector 31 is formed of pyrolytic graphite, damage to the upper reflector 31 is suppressed as compared with a case where upper reflector 31 is formed of silicon carbide. Therefore, the durability of the upper reflector 31 is improved. In addition, since damage to the upper reflector 31 is suppressed by forming the upper reflector 31 using pyrolytic graphite, the degree of freedom in designing the shape or position of a notched portion and the size or position of a through hole in the upper reflector 31 increases.

The ratio of the inner diameter d4 of the out-heater 26 to the outer diameter d3 of the out-heater 26 is preferably 70% or less. As the ratio of the inner diameter d4 of the out-heater 26 to the outer diameter d3 of the out-heater 26 decreases, the temperature gradient in the vicinity of the outer peripheral edge of the upper reflector 31 increases. Therefore, there is a high possibility that the upper reflector 31 will be damaged.

Since the upper reflector 31 is formed of pyrolytic graphite, damage to the upper reflector 31 is suppressed even when the ratio of the inner diameter d4 of the out-heater 26 to the outer diameter d3 of the out-heater 26 is small. Since damage to the upper reflector 31 is suppressed by forming the upper reflector 31 using pyrolytic graphite, the degree of freedom in designing the shape of the out-heater 26 increases.

In addition, for example, when forming a nitride semiconductor film, such as an indium gallium nitride film (InGaN film) or a gallium nitride film (GaN film), by supplying a gas containing ammonia ($NH_3$) to the reactor 10, if the material of the upper reflector 31 is graphite, ammonia and graphite may react with each other to etch the upper reflector 31. As the etching of the upper reflector 31 progresses, for example, the mechanical strength of the upper reflector 31 may be reduced to damage the upper reflector 31. For this reason, there arises a problem that periodical replacement is required and the film formation cost increases. In addition, as the etching of the upper reflector 31 progresses, for example, the reflectance of the surface of the upper reflector 31 may change to lower the uniformity of the wafer temperature.

The upper reflector 31 of embodiments is formed of pyrolytic graphite. Since the upper reflector 31 is formed of pyrolytic graphite, the etching of the upper reflector 31 is suppressed as compared with a case of graphite obtained by sintering, for example. Therefore, since a reduction in the mechanical strength of the upper reflector 31 is suppressed, it is possible to suppress damage to the upper reflector 31. In addition, it is possible to suppress the lowering in the uniformity of the wafer temperature. Therefore, the durability of the upper reflector 31 is improved.

It is thought that the reason why the etching of pyrolytic graphite is suppressed is that pyrolytic graphite has a density of 2.0 $g/cm^3$ or more, which is higher than that of graphite obtained by sintering. It is known that the etching rate of graphite by ammonia decreases as the density of graphite increases.

From the viewpoint of suppressing damage to the upper reflector 31 and improving the durability of the upper reflector 31, the thermal shock resistance of pyrolytic graphite forming the upper reflector 31 is preferably 1000 kW/m or more, more preferably 2000 kW/m or more.

From the viewpoint of suppressing the etching of the upper reflector 31 by ammonia and improving the durability of the upper reflector 31, the density of pyrolytic graphite forming the upper reflector 31 is preferably 2.0 $g/cm^3$ or more, more preferably 2.1 $g/cm^3$ or more.

As described above, according to embodiments, it is possible to realize a highly durable reflector unit. In addition, according to embodiments, it is possible to realize a vapor phase growth apparatus including a reflector unit with improved durability.

Up to now, embodiments have been described with reference to specific examples. Embodiments are merely given as examples, and do not limit the invention. In addition, the components of embodiments may be combined as appropriate.

In addition, in embodiments, pyrolytic graphite has been described as an example of graphite forming the upper reflector 31. However, the graphite forming the upper reflector 31 is not limited to pyrolytic graphite. For example, even with graphite other than pyrolytic graphite, it is possible to realize a highly durable reflector unit as in the case of pyrolytic graphite by forming the upper reflector 31 with graphite having a thermal shock resistance of 1000 kW/m or more and a density of 2.0 $g/cm^3$ or more. In addition, it is possible to realize a vapor phase growth apparatus including a reflector unit with improved durability.

In addition, in embodiments, pyrolytic graphite has been described as an example of a material forming the upper reflector 31. However, the material forming the upper reflector 31 is not limited to pyrolytic graphite. For example, by forming the upper reflector 31 with a material other than pyrolytic graphite, which has a thermal shock resistance of 1000 kW/m or more, it is possible to realize a highly durable reflector unit as in the case of pyrolytic graphite. In addition, it is possible to realize a vapor phase growth apparatus including a reflector unit with improved durability.

Materials other than pyrolytic graphite are, for example, high melting point metals or ceramics having a thermal shock resistance of 1000 kW/m or more.

In addition, in embodiments, the case where the reflector has both a notched portion and a through hole has been described as an example. However, it is also possible for the reflector to have either one of the notched portion and the through hole.

In embodiments, the case where the number of support column through holes H1 is three has been described as an example. However, the number of support column through holes H1 may be four or more. In addition, a through hole provided in the outer region 31b of the upper reflector 31 may be the push up pin through hole H2 or a through hole having other functions. In addition, the shape of the notched portion is not limited to the shape shown in FIG. 3A.

In embodiments, the case of epitaxially growing a stacked film in which a plurality of indium gallium nitride films and a plurality of gallium nitride films are stacked on a GaN film has been described as an example. However, without being limited to the MQW stacked film, embodiments can also be suitably used when forming an indium gallium nitride film (InGaN film) or the like on an upper layer such as a gallium nitride film (GaN film) used for a high electron mobility transistor (HEMT). In addition, for example, embodiments can also be applied to form single crystal films of other group III-V nitride semiconductors, such as aluminum nitride (AlN) and aluminum gallium nitride (AlGaN). In addition, embodiments can also be applied to group III-V semiconductors, such as GaAs. In addition, embodiments can also be applied to form other films.

In addition, in embodiments, the case where the process gas is mixed in the shower plate has been described as an example. However, the process gas may be mixed before entering the shower plate. In addition, the process gas may be separated until the process gas is ejected from the shower plate into the reactor.

In embodiments, the description of parts that are not directly required for the description of embodiments, such as an apparatus configuration, is omitted. However, the required device configuration and the like can be appropriately selected and used. In addition, all reflectors and vapor phase growth apparatuses that include the elements of embodiments and that can be appropriately redesigned by those skilled in the art are included in the scope of the inventions. The scope of the inventions is defined by the scope of claims and the scope of their equivalents.

What is claimed is:

1. A vapor phase growth apparatus, comprising:
   a reactor;
   a holder provided in the reactor configured to place a substrate thereon;
   an annular out-heater provided below the holder;
   an in-heater provided below the out-heater;

a disk-shaped upper reflector provided below the in-heater and formed of a material having a thermal shock resistance of 1000 kW/m or more;

a disk-shaped lower reflector provided below the upper reflector, formed of silicon carbide, and having a thickness smaller than a thickness of the upper reflector; and a support column supporting the upper reflector, wherein the upper reflector has an inner region and an outer region surrounding the inner region, the outer region includes an outer periphery of the upper reflector, an inner diameter of the outer region is 40% or more of an outer diameter of the upper reflector, the upper reflector has a notched portion and a support column through hole in the outer region, the notched portion is provided on the outer periphery of the upper reflector, the support column penetrates the support column through hole, and a ratio of an inner diameter of the out-heater to an outer diameter of the out-heater is 70% or less.

2. The vapor phase growth apparatus according to claim 1, wherein the material is pyrolytic graphite.

3. The vapor phase growth apparatus according to claim 2, wherein the pyrolytic graphite has a density of 2.0 g/cm$^3$ or more.

4. The vapor phase growth apparatus according to claim 1, wherein a minimum distance between the notched portion and the support column through hole is 5% or less of an outer diameter of the upper reflector.

5. The vapor phase growth apparatus according to claim 1, wherein a ratio of an outer diameter of the in-heater to the outer diameter of the out-heater is 90% or more and 110% or less, and a ratio of an outer diameter of the upper reflector to the outer diameter of the out-heater is 90% or more and 110% or less.

6. The vapor phase growth apparatus according to claim 1, wherein a clearance is provided between the support column through hole and the support column.

7. The vapor phase growth apparatus according to claim 1,

Wherein at least one of a support portion of the in-heater, a support portion of the out-heater, an electrode connected to the in-heater or an electrode connected to the out-heater is passed through the notched portion.

* * * * *